United States Patent
Ko et al.

(10) Patent No.: US 8,450,211 B2
(45) Date of Patent: May 28, 2013

(54) METHOD FOR FABRICATING SEMICONDUCTOR DEVICE

(75) Inventors: Soo-Byung Ko, Gyeonggi-do (KR);
Kee-Joon Oh, Gyeonggi-do (KR);
Sung-Hyun Yoon, Gyeonggi-do (KR);
Soon-Young Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 71 days.

(21) Appl. No.: 13/240,340

(22) Filed: Sep. 22, 2011

(65) Prior Publication Data

US 2012/0220124 A1 Aug. 30, 2012

(30) Foreign Application Priority Data

Feb. 28, 2011 (KR) .................. 10-2011-0017805

(51) Int. Cl.
*H01L 21/44* (2006.01)
*H01L 21/311* (2006.01)
*H01L 21/4763* (2006.01)

(52) U.S. Cl.
USPC ........... 438/675; 438/677; 438/694; 438/637; 438/672

(58) Field of Classification Search
USPC .......................... 438/675, 677, 694, 637, 672
See application file for complete search history.

(56) References Cited

U.S. PATENT DOCUMENTS

| | | | | |
|---|---|---|---|---|
| 5,592,024 A | * | 1/1997 | Aoyama et al. | 257/751 |
| 6,008,117 A | * | 12/1999 | Hong et al. | 438/629 |
| 6,376,328 B1 | * | 4/2002 | Aiso et al. | 438/398 |
| 7,619,310 B2 | * | 11/2009 | Huebinger et al. | 257/758 |

FOREIGN PATENT DOCUMENTS

| | | |
|---|---|---|
| KR | 1020050024010 | 3/2005 |
| KR | 1020060099608 | 9/2006 |
| KR | 1020080092538 | 10/2008 |
| KR | 1020090072093 | 7/2009 |

OTHER PUBLICATIONS

Office Action issued by the Korean Intellectual Property Office on Jun. 12, 2012.

* cited by examiner

*Primary Examiner* — Luan C Thai
(74) *Attorney, Agent, or Firm* — IP & T Group LLP

(57) ABSTRACT

A method for fabricating a semiconductor device includes forming an insulation layer containing an impurity, forming a contact hole by etching the insulation layer, performing a treatment to decrease a concentration of the impurity on a surface of the insulation layer, and rinsing the contact hole.

20 Claims, 7 Drawing Sheets

Skip(15nm)

Acid treatment(23nm)

METHOD FOR FABRICATING SEMICONDUCTOR DEVICE

CROSS-REFERENCE TO RELATED APPLICATIONS

The present application claims priority of Korean Patent Application No. 10-2011-0017805, filed on Feb. 28, 2011, which is incorporated herein by reference in its entirety.

BACKGROUND

1. Field

Exemplary embodiments of the present invention relate to a method for fabricating a semiconductor device, and more particularly, to a semiconductor device fabrication method that may secure a proper dimension margin between contact holes.

2. Description of the Related Art

As the integration degree of semiconductor devices increase with the development of under-30 nm processing technology, the critical dimensions (CD) (e.g., line widths) of patterns for gates, bit lines, vias, contact holes, etc. become smaller and thus, it becomes more difficult to form the appropriate patterns. Particularly, with the increased integration degree, the aspect ratios of patterns also increase, and thus, it is more difficult to perform processes for forming an inter-layer dielectric (ILD) layer.

Here, an insulation layer, such as a Tetraethyl Orthosilicate (TEOS) layer, a High-Density Plasma (HDP) layer, or a Boron Phosphorus Silicate Glass (BPSG) layer, may be used for an inter-layer dielectric layer. However, due to limitations as a gap-fill material, use of TEOS layer or HDP layer as an inter-layer dielectric layer has been difficult.

According to another example, a method of using a Spin-On Dielectric (SOD) layer may be used to obtain excellent gap-fill performance. Here, an SOD layer is formed by applying a polysilazane-based material (e.g., perhydropolysilazane (PSZ)) through a spin coating method and performing a high-temperature thermal treatment. Processes for forming a polysilazane-based SOD layer are relatively simple and have a high throughput.

The polysilazane-based SOD layer, however, is often formed by a thermal treatment performed at approximately 850° C. or higher, where a compositional change and a volume shrinkage may occur due to the fume generated during the thermal treatment and thus cause deformation in pattern shapes. As the inner and lower portions of the polysilazane-based SOD layer are prone to not having complete densification, voids may be produced during subsequent processes.

Because of the above-discussed features of conventional examples, Boron-Phosphorus-Silicate Glass (BPSG) has been often used for forming an inter-layer dielectric layer.

A BPSG layer has an advantage that its gap-fill performance may be increased by increasing the concentrations of boron and phosphorus in the layer and increasing the temperature of a subsequent annealing process.

FIG. 1 is a cross-sectional view illustrating a method for fabricating a semiconductor device according to prior art.

Referring to FIG. 1, an isolation layer 12 to fill trenches is formed by performing a Shallow Trench Isolation (STI) process on a substrate 11. Subsequently, contact plugs 13 are formed over the substrate 11.

Subsequently, an inter-layer dielectric layer 14 is formed over the substrate structure including the contact plugs 13. The inter-layer dielectric layer 14 includes BPSG. The inter-layer dielectric layer 14 is planarized through a Chemical Mechanical Polishing (CMP) process.

Subsequently, contact holes 15 are formed by etching the inter-layer dielectric layer 14, which is cleaned afterward through a cleaning process.

According to an example, BPSG used as the inter-layer dielectric layer 14 may produce byproducts such as boron phosphate ($BPO_4$) crystallite when the concentration of boron and/or phosphorus is relatively high. In such a case, it may be difficult to perform a CMP process. Further, with respect to an etchant used during a dry etch process and a wet etch process, BPSG has a faster etch rate than a silicon oxide ($SiO_2$) layer, where, if the cleaning process is performed rigorously, a bridge 16 may be produced in the resulting structure.

Thus, it may be useful to have a semiconductor device fabrication method that can minimize/reduce the loss of an inter-layer dielectric layer during etching processes by inducing densification locally on exposed BPSG.

SUMMARY

An exemplary embodiment of the present invention is directed to a semiconductor device fabrication method that may prevent bridge formation due to loss of an inter-layer dielectric layer during a cleaning process.

In accordance with an exemplary embodiment of the present invention, a method for fabricating a semiconductor device includes: forming an insulation layer containing an impurity; forming a contact hole by etching the insulation layer; performing a treatment to decrease a concentration of the impurity on a surface of the insulation layer; and rinsing the contact hole.

In accordance with another exemplary embodiment of the present invention, a method for fabricating a semiconductor device includes: forming a plurality of patterns over a substrate; forming an inter-layer dielectric layer to gap-fill spaces between the patterns, wherein inter-layer dielectric layer contains phosphorus as an impurity; forming a contact hole by etching the inter-layer dielectric layer; performing a treatment for decreasing a concentration of the impurity on a surface of the inter-layer dielectric layer; and rinsing the contact hole.

In accordance with another exemplary embodiment of the present invention, a method for fabricating a semiconductor device includes: forming a first contact plug over a substrate; forming a Boron-Phosphorus-Silicate Glass (BPSG) layer over the first contact plug; forming a contact hole that exposes the first contact plug by etching the BPSG layer; performing a treatment on sidewalls of the contact hole by using a solution prepared by mixing sulfuric acid and hydrogen peroxide; rinsing the contact hole; and forming a second contact plug in the contact hole.

DETAILED DESCRIPTION

Figure 1:
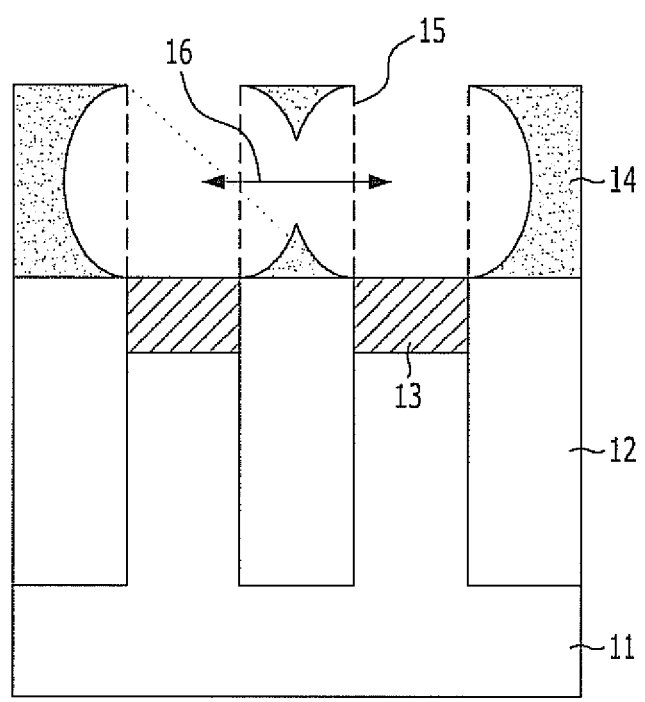
FIG. 1 is a cross-sectional view illustrating a method for fabricating a semiconductor device according to prior art.

Exemplary embodiments of the present invention will be described below in more detail with reference to the accompanying drawings. The present invention may, however, be embodied in different forms and should not be construed as limited to the exemplary embodiments set forth herein. Rather, these exemplary embodiments are provided so that this disclosure will be thorough and complete, and will fully convey the scope of the present invention to those skilled in the art. Throughout the disclosure, like reference numerals refer to like parts throughout the various figures and exemplary embodiments of the present invention.

The drawings are not necessarily to scale and in some instances, proportions may have been exaggerated in order to clearly illustrate features of the exemplary embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2:
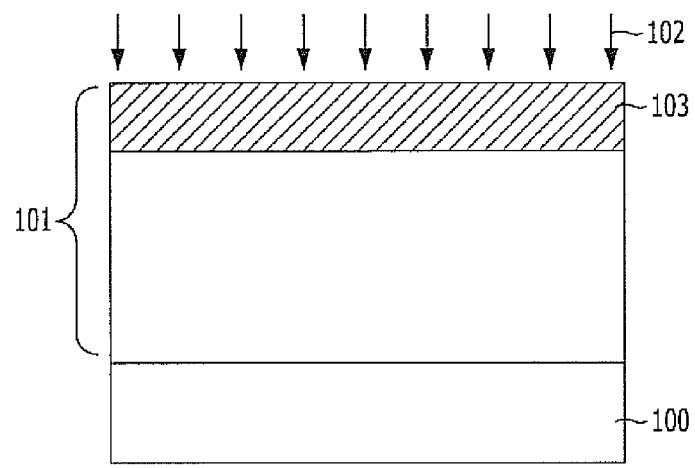
FIG. 2 is a cross-sectional view illustrating a pre-treatment method for performing a pre-treatment on an insulation layer in accordance with an exemplary embodiment of the present invention.

FIG. 2 is a cross-sectional view illustrating a pre-treatment on an insulation layer in accordance with an exemplary embodiment of the present invention.

Referring to FIG. 2, an insulation layer 101 including boron (B) and phosphorus (P) is formed over a substrate 100 as an inter-layer dielectric (ILD) layer. Here, the insulation layer 101 includes at least any one impurity among boron and phosphorus. For example, the insulation layer 101 may include BPSG including boron (B) and phosphorus (P), phosphorus silicate glass (PSG) including phosphorus (P), and boron silicate glass (BSG) including boron (B). Also, the insulation layer 101 may be formed to gap-fill the gap between the patterns formed over the substrate 100. The surface of the insulation layer 101 may be planarized through a Chemical Mechanical Polishing (CMP) processing.

Subsequently, a pre-treatment 102 is performed. The pre-treatment 102 is performed using a pre-treatment solution. The pre-treatment solution is prepared by mixing a catalyst which captures an impurity (e.g., boron (B) and/or phosphorus (P)) in the insulation layer 101 and an oxidizing agent for oxidizing areas after the removal of the impurity by the catalyst. The catalyst may be any reasonably suitable acid having a relatively small acid dissociation constant (pKa). Examples of the catalyst include perchloric acid, hydroiodic acid, hydrobromic acid, hydrochloric acid, peroxymonosulfuric acid, and sulfuric acid. The acid dissociation constant (pKa) for the foregoing acids ranges from approximately −10 to approximately 1. An acid having such a relatively small acid dissociation constant (pKa) is considered to be a strong acid and may be an inorganic acid or an organic acid. The pre-treatment solution includes such an acid in an amount of approximately 10 wt % to approximately 40 wt %. The oxidizing agent may be any reasonably suitable aqueous solution. For example, the oxidizing agent may be hydrogen peroxide ($H_2O_2$), ozone ($O_3$), etc. The pre-treatment solution may include the oxidizing agent in an amount of approximately 1 wt % to approximately 10 wt %. The mixing ratio of the oxidizing agent to the catalyst may range from approximately 4:1 to approximately 50:1, where the 4:1 pre-treatment solution has a higher oxidizing agent ratio in the solution than a 50:1 pre-treatment solution.

The pre-treatment 102 process is performed by immersing the substrate 100 in the pre-treatment solution at a room temperature to approximately 250° C. for approximately 5 minutes to approximately 60 minutes. According to an example, the pre-treatment 102 is performed at a temperature of approximately 90° C. to approximately 250° C. Here, as the temperature for performing the pre-treatment 102 is increased, the impurity removal and the densification (e.g., achieving greater density and/or hardness) intensify.

Here, the impurity removal and the densification resulting from the pre-treatment 102 depend on the length of time that a pre-treatment is performed, mixing ratio, and the temperature used. For example, as the length of time that the pre-treatment is performed becomes longer, the ratio of the oxidizing agent in the pre-treatment solution becomes greater, or the temperature used increases, the impurity removal and the densification intensify.

The pre-treatment 102 is followed by a rinsing process and a drying process. For the rinsing process, alcohol and/or water may be used. The drying process may be performed in the atmosphere of isopropyl alcohol (IPA) and nitrogen ($N_2$) gas.

As described above, when the pre-treatment 102 is performed, the surface of the insulation layer 101 is densified.

The process of densifying the surface of the insulation layer 101 is as follows.

As described above, a pre-treatment is performed on an insulation layer including at least any one impurity among boron (B) and phosphorus (P) by using a material having a relatively small acid dissociation constant (pKa). Examples of the insulation layers including boron and/or phosphorus include BPSG, PSG, and BSG.

Here, the acid dissociation constant (pKa) is used a barometer for quantitatively representing the intensity of an acid. More specifically, a dissociation reaction where protons are released from an acid is taken into consideration and is represented by the balance integer Ka or its negative common logarithms (−log) (pKa) according to an example. As described above, as the pKa becomes smaller, the acid becomes stronger. According to an example, a material having a relatively small acid dissociation constant (pKa) may be an acid aqueous solution. The material having a relatively small acid dissociation constant (pKa) is a strong acid material. In the exemplary embodiment of the present invention, a strong acid has an acid dissociation constant (pKa) ranging from approximately −10 to approximately 1. Strong acids include inorganic acids and organic acids having an acid dissociation constant (pKa) ranging from approximately −10 to approximately 1. The use of a strong acid may shorten the pre-treatment time and maximize the densification of the insulation layer. If a weaker acid is used, it takes a longer time to perform the pre-treatment and since the pre-treatment takes longer, materials around the insulation layer may be damaged.

According to the exemplary embodiment, the aqueous solution becomes an oxidizing agent, and the strong acid becomes a catalyst that removes impurities. Therefore, when the pre-treatment is performed using a pre-treatment solution including an aqueous solution where a strong acid is dissolved for BPSG, PSG and BSG, the surface of the insulation layer is dehydrated and/or oxidized and thus further densify (e.g., achieve greater density and/or hardness) the surface. For example, boron (B) and phosphorus (P) melt in the presence of the strong acid, and the voids previously occupied by the molten boron (B) and phosphorus (P) become oxidized by the oxidizing agent. As such, the insulation layer becomes densified to form a densified layer 103. In addition, $B_2O_3(s)$, $P_2O_3(s)$, and $P_2O_5(s)$ present in the insulation layer 101 receive acidic proton from the high-acidity pre-treatment solution to thereby form ions such as boric acid $(B(OH)_3)$, tetrahydroxyborate ion, phosphate ion, hydrogen phosphate ion, and dihydrogen phosphate ion. The ions thus formed undergo solvation in the aqueous solution and removed during a rinsing process. In the foregoing processes, boron and phosphorus are removed from the surface of the insulation layer, where the concentrations of boron and phosphorus become lower on the surface. With the remaining structure, loss of BPSG during the subsequent rinsing process may be reduced and CD margin may be secured.

As described above, once the boron and phosphorus melt in the presence of the strong acid, the concentration of boron and phosphorus may be reduced. When the concentrations of boron and phosphorus within the insulation layer are decreased, diffusion into neighboring materials may be prevented so as to improve the reliability of the semiconductor device. After gap-filling the gap, the decrease in the concentrations of boron and phosphorus does not affect the insulation characteristics of the insulation layer 101. Here, the high concentrations of boron and phosphorus already contributed to improvement of the gap-fill characteristics of the insulation layer 101, the subsequent decrease in the concentrations of boron and phosphorus does not cause functional detriments.

According to the above description, since the pre-treatment 102 is performed using the pre-treatment solution obtained by mixing the catalyst (strong acid), which induces densification of the insulation layer 101 (e.g., BPSG and PSG) including boron and phosphorus and the oxidizing agent for causing oxidization, the insulation layer 101 becomes densified. As a result, loss of neighboring materials does not occur in subsequently performing the rinsing process.

The byproducts generated during the pre-treatment 102 may be properly removed during the subsequent rinsing and drying processes without causing damage to the resulting structure.

FIGS. 3A to 3E are cross-sectional views describing a method for fabricating a semiconductor device using a pre-treatment method in accordance with an exemplary embodiment of the present invention.

Figure 3A:
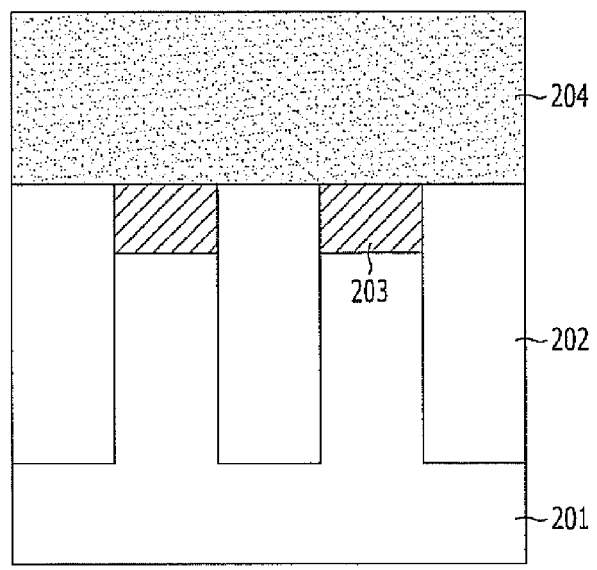
FIGS. 3A to 3E are cross-sectional views describing a method for fabricating a semiconductor device using a pre-treatment method in accordance with an exemplary embodiment of the present invention.

Referring to FIG. 3A, an isolation layer 202 is formed over the substrate 201 to fill trenches through a Shallow Trench Isolation (STI) process. According to another example, the isolation layer 202 may be a Spin-On Dielectric (SOD) layer or a I-Ugh-Density Plasma (HDP) oxide layer.

First contact plugs 203 are formed over the substrate 201. The first contact plugs 203 may be landing plugs and may be formed of polysilicon. Although not illustrated in the drawings, buried gates may be formed in the substrate 201.

Subsequently, an inter-layer dielectric layer 204 is formed over the substrate structure including the first contact plugs 203. The inter-layer dielectric layer 204 may be an insulation layer including at least any one impurity among boron (B) and phosphorus (P). For example, the inter-layer dielectric layer 204 includes a silicon oxide layer including an impurity. The inter-layer dielectric layer 204 may include BPSG containing boron (B) and phosphorus (P), PSG containing phosphorus (P), or BSG containing boron (B).

Figure 3B:
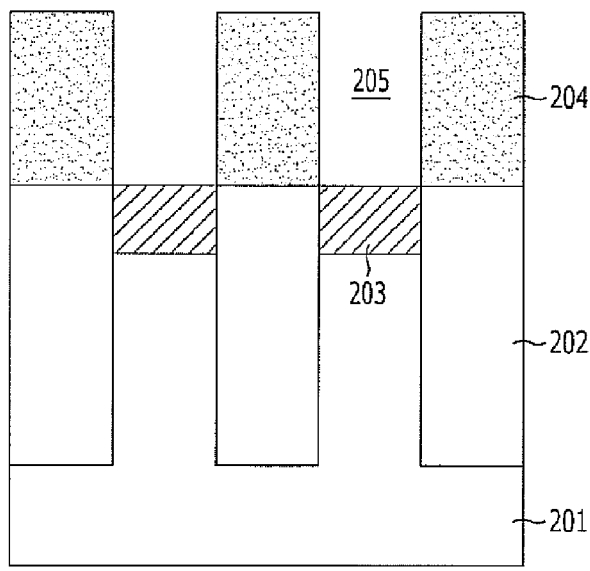

Referring to FIG. 3B, contact holes 205 are formed by etching the inter-layer dielectric layer 204. Here, the contact holes 205 may be bit line contact holes or storage node contact holes. Here, for purposes of illustration, it is assumed that the contact holes 205 are storage node contact holes.

The contact holes 205 expose the surface of the first contact plugs 203. Also, the inter-layer dielectric layer 204 is exposed on the sidewalls outlining each contact hole 205.

Figure 3C:
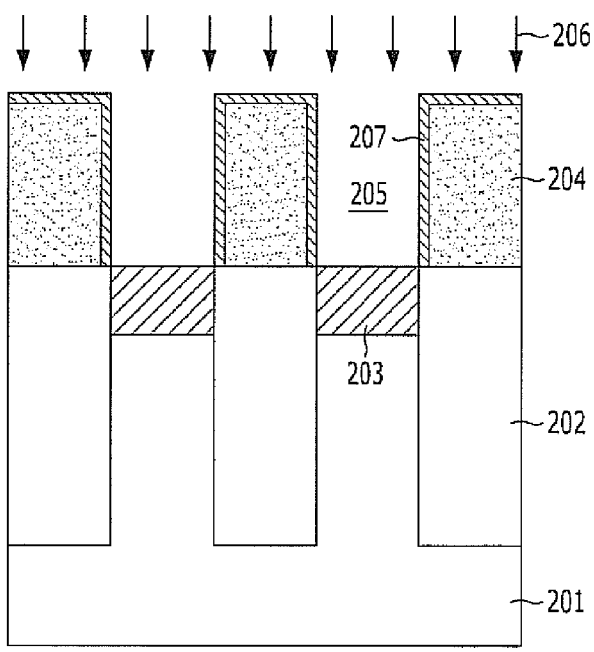

Referring to FIG. 3C, a pre-treatment 206 is performed. The pre-treatment 206 is performed using a pre-treatment solution. The pre-treatment solution is a solution containing a catalyst for removing the impurity (boron (B) and/or phosphorus (P)) in the inter-layer dielectric layer 204 and an oxidizing agent for oxidizing the areas from which the impurity has been removed. The catalyst includes acids having a relatively small acid dissociation constant (pKa). The examples of the catalyst include perchloric acid, hydroiodic acid, hydrobromic acid, hydrochloric acid, peroxymonosulfuric acid, and sulfuric acid. The acid dissociation constant (pKa) of the above acids ranges from approximately −10 to approximately 1. An acid having such a small acid dissociation constant (pKa) is considered to be a strong acid and may be an inorganic acid or an organic acid. The pre-treatment solution includes such an acid in an amount of approximately 10 to approximately 40 wt %. The oxidizing agent may be any reasonably suitable aqueous solution. For example, the oxidizing agent may be hydrogen peroxide ($H_2O_2$), ozone ($O_3$), etc. The pre-treatment solution may include the oxidizing agent in an amount of approximately 1 wt % to approximately 10 wt %. The mixing ratio of the oxidizing agent to the catalyst may range from approximately 4:1 to approximately 50:1, where the 4:1 pre-treatment solution has a higher oxidizing agent ratio in the solution than a 50:1 pre-treatment solution.

The pre-treatment 206 process is performed by immersing the substrate 201 in the pre-treatment solution at a room temperature to approximately 250° C. for approximately 5 minutes to approximately 60 minutes. According to an example, the pre-treatment 206 is performed at a temperature of approximately 90° C. to approximately 250° C. Here, as the temperature for performing the pre-treatment 206 is increased, the impurity removal and the densification intensify.

Here, the impurity removal and the densification resulting from the pre-treatment 206 depend on the length of time that a pre-treatment time is performed, mixing ratio, and the temperature used. For example, as the pre-treatment time becomes longer, the ratio of the oxidizing agent in the pre-treatment solution becomes greater, and the temperature is high, the densification and the impurity removal intensify.

The pre-treatment 206 is followed by a rinsing process and a drying process. For the rinsing process, alcohol and/or water may be used. The drying process may be performed in the atmosphere of isopropyl alcohol (IPA) and nitrogen ($N_2$) gas.

As described above, when the pre-treatment 206 is performed, the surface of inter-layer dielectric layer 204 on the sidewalls of each contact hole 205 densify. As a result, a densified layer 207 is formed.

The densified layer 207 is a silicon oxide layer with decreased concentration of boron (B) and phosphorus (P). The densified layer 207 is denser than untreated BPSG, PSG, and BSG. In the exemplary embodiment of the present invention, a strong acid has an acid dissociation constant (pKa) ranging from approximately −10 to approximately 1. A strong acid may be an inorganic acid or an organic acid having an acid dissociation constant (pKa) ranging from approximately −10 to approximately 1. The use of a strong acid may shorten the pre-treatment time and maximize the densification effect of the inter-layer dielectric layer 204. If a weak acid having an acid dissociation constant (pKa) of 1 or more is used, it takes a relatively long time to perform the pre-treatment and because of the long pre-treatment time, the materials around the inter-layer dielectric layer 204 may be damaged.

As described above, by melting the boron (B) and phosphorus (P) with the strong acid, the concentration of boron (B) and phosphorus (P) in the inter-layer dielectric layer 204 may be acquired. When the concentration of boron (B) and phosphorus (P) in the inter-layer dielectric layer 204 are decreased, diffusion into the neighboring materials may be prevented so as to improve the reliability of the semiconductor device. After gap-filling the gap, the decrease in the concentrations of boron (B) and phosphorus (P) does not affect the insulation characteristics of the inter-layer dielectric layer 204. Here, the high concentrations of boron (B) and phosphorus (P) already contributed to improvement of the gap-fill characteristics of the inter-layer dielectric layer 204, the subsequent decrease in the concentration of boron and phosphorus does not cause functional detriments.

According to the above description, since the pre-treatment 206 is performed using the pre-treatment solution obtained by mixing the catalyst (strong acid), which induces densification of the inter-layer dielectric layer 204 (e.g., BPSG and PSG) including boron (B) and phosphorus (P) and the oxidizing agent for causing oxidization, the inter-layer dielectric layer 204 becomes densified. As a result, the pre-treatment 206 is formed, and loss of the inter-layer dielectric layer 204 does not occur in the subsequently performed rinsing process due to the presence of the densified layer 207.

The byproducts generated during the pre-treatment 206 may be properly removed during the subsequent rinsing and drying processes without causing damage to the resulting structure.

Figure 3D:
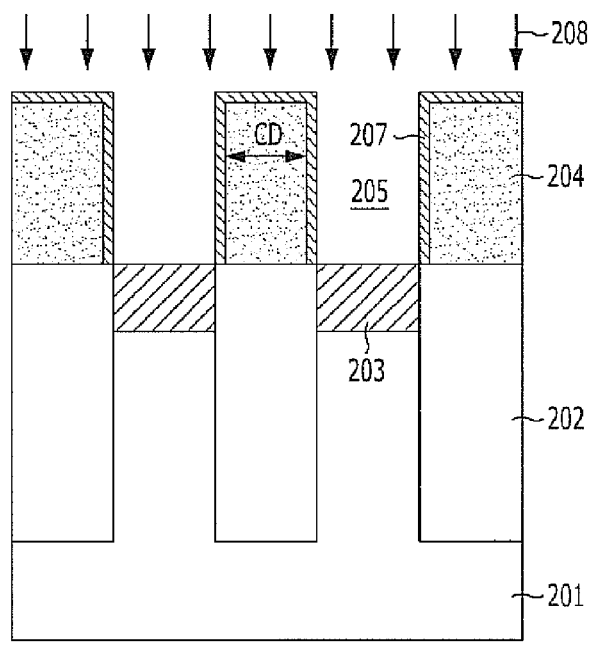

Referring to FIG. 3D, the rinsing process 208 is performed. The rinsing process 208 is performed to facilitate the subsequent formation of second contact plugs. The rinsing process 208 includes a dry rinsing process performed using a gas and/or a wet rinsing process performed using a solution. According to an example, the rinsing process 208 is performed using a buffer oxide echant (BOE) solution.

Although the rinsing process 208 may be rigorously performed, the loss of the inter-layer dielectric layer 204 may be reduced due to the decreased concentrations of boron (B) and phosphorus (P) on the sidewalls of each contact hole 205. As a result, the critical dimension (CD) margin between the contact holes 205 may be appropriately secured.

Figure 3E:
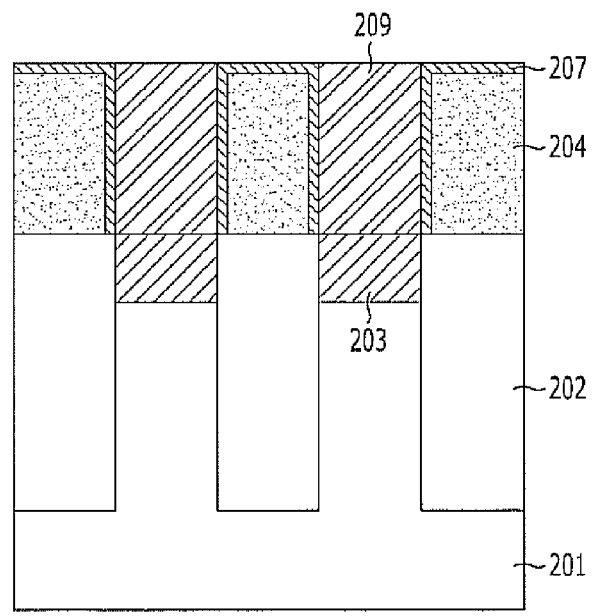

Referring to FIG. 3E, second contact plugs 209 filling the contact holes 205 are formed. The second contact plugs 209 may be storage node contact plugs and may be formed of polysilicon or metal. According to an example, polysilicon or metal is deposited until the contact holes 205 are filled, and the contact holes 205 may be separated from each other by performing a Chemical Mechanical Polishing (CMP) process.

Figure 4A:
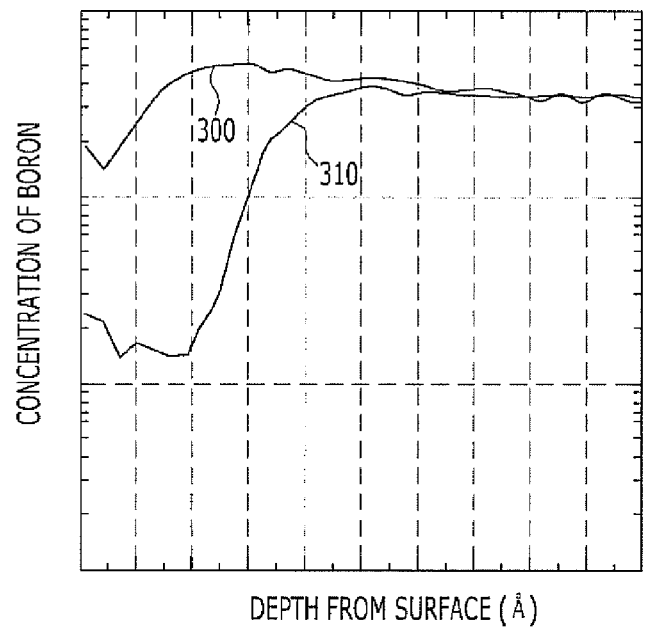
FIGS. 4A and 4B are graphs showing the concentrations of boron and phosphorus of a Boron-Phosphorus-Silicate Glass (BPSG) layer after a pre-treatment in accordance with an exemplary embodiment of the present invention.
Figure 4B:
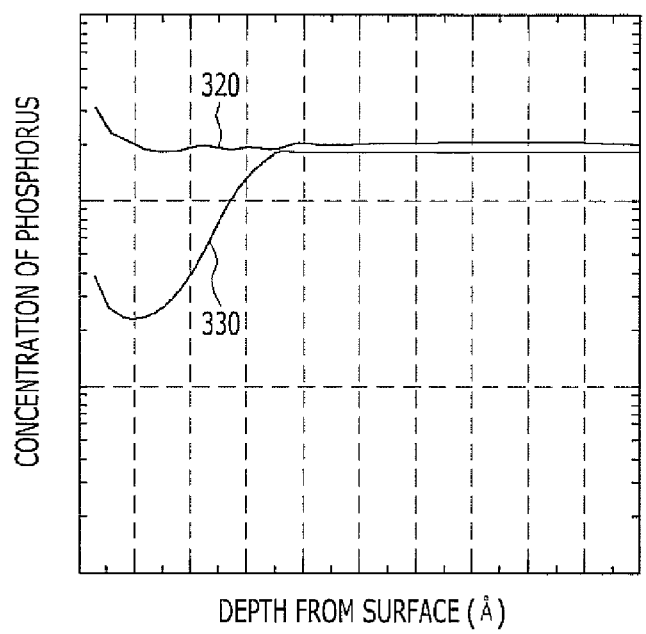

FIGS. 4A and 4B are graphs showing the concentrations of boron and phosphorus of a Boron-Phosphorus-Silicate Glass (BPSG) layer after a pre-treatment in accordance with an exemplary embodiment of the present invention.

Referring to FIGS. 4A and 4B, when the contact holes 205 in FIG. 3C are formed by etching the BPSG layer and pre-treatment using sulfuric acid peroxide mixture (SPM) is performed, the concentration (300) of boron (B) and the concentration (320) of phosphorus (P) on the sidewalls outlining each contact hole are remarkably decreased to a certain depth below the surface. As shown in the drawings, concentration 310 shows a decreased concentration of boron (B), while a concentration 330 shows a decreased concentration of phosphorus (P).

EXPERIMENTAL EXAMPLE 1

In Experimental Example 1, variations in the concentrations of boron (B) and phosphorus (P) were examined by using plane wafers.

A Boron-Phosphorus-Silicate Glass (BPSG) layer was deposited at a thickness of approximately 1.8 KÅ over a plane silicon wafer, and an annealing process was performed at approximately 750° C. Subsequently, the BPSG layer was removed by approximately 300 Å through a "touch" Chemical Mechanical Polishing (CMP) process. Subsequently, the wt % concentrations of the boron (B) and phosphorus (P) in the BPSG layer were measured. Then, the BPSG layer went through a pre-treatment using diverse kinds of acid aqueous solutions and the wt % concentrations of the boron (B) and phosphorus (P) in the BPSG layer were measured. The results showed that the pre-treatment reduced the wt % concentrations of the boron (B) and phosphorus (P) in the BPSG layer to some degree. When a wet etch process was performed using a buffered oxide etchant (BOE), the etch rate was decreased.

Figure 5A:
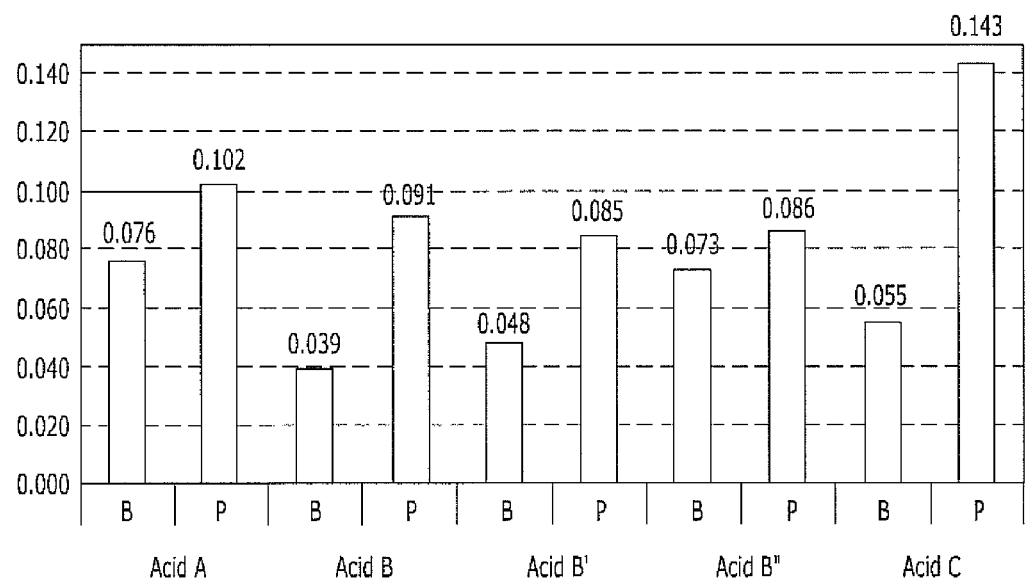
FIG. 5A is a graph showing the concentrations of boron and phosphorus of a BPSG layer after a pre-treatment in accordance with an exemplary embodiment of the present invention.

FIG. 5A shows the differences in the concentrations of boron (B) and phosphorus (P) after the pre-treatment was performed on the BPSG layer. It may be seen from FIG. 5A that the differences between the concentrations (Δ) before and after the pre-treatment are relatively great. The differences in the concentrations before and after the pre-treatment have different magnitudes and reflect differences in the pre-treatment conditions such as time, temperature, etc. Here, when the pre-treatment is not performed, there are little changes in the concentrations of boron (B) and phosphorus (P).

Figure 5B:
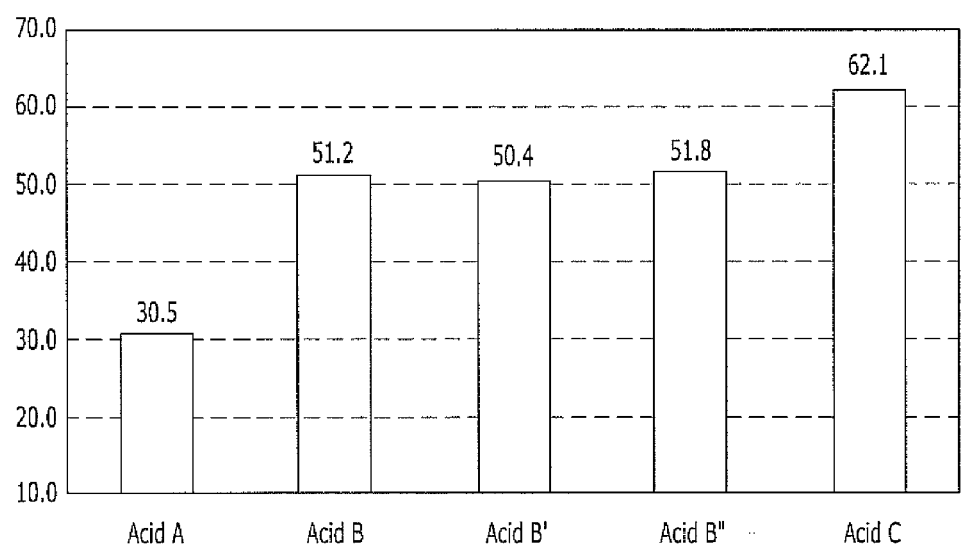
FIG. 5B is a graph showing wet etch rates of the BPSG layer after a pre-treatment.

FIG. 5B shows wet etch rates after the pre-treatment is performed on the BPSG layer. It may be seen from FIG. 5B that the etch rate is significantly decreased when the subsequent rinsing process using a BOE solution was performed. Although there is a difference in the wet etch rate, it is because the conditions such as time, temperature, etc. were different during the pre-treatment. Here, when the pre-treatment was not performed, approximately 180 Å of loss occurred through the subsequent rinsing process.

In FIGS. 5A and 5B, sample specimens acids A, B, B', B", and C had the following pre-treatment conditions.

The pre-treatment conditions of Acid A were $H_2SO_4$:$H_2O_2$=10:1, 180° C., and 600 seconds.

The pre-treatment conditions of Acid B were $H_2SO_4$:$H_2O_2$=4:1, 120° C., and 450 seconds.

The pre-treatment conditions of Acid B' were $H_2SO_4$:$H_2O_2$=4:1, 120° C., and 1800 seconds.

The pre-treatment conditions of Acid B" were $H_2SO_4$:$H_2O_2$=4:1, 120° C., and 3600 seconds.

The pre-treatment conditions of Acid C were $H_2SO_4$:$H_2O_2$=50:1, 80° C., and 450 seconds.

EXPERIMENTAL EXAMPLE 2

In Experimental Example 2, the critical dimension margin of a BPSG layer is secured by using a pattern wafer.

A BPSG layer is deposited at a thickness of approximately 1.8 KÅ over a plane silicon wafer, and an annealing process is performed at approximately 750° C. Subsequently, the BPSG layer is removed by approximately 300 Å through a "touch" CMP process. Subsequently, a pattern having a hole of approximately 115 nm in the major axis and approximately 66 nm in the minor axis is formed through a mask process and an etch process. Subsequently, a splitting process is performed according to whether a pre-treatment using an acid aqueous solution is performed or not, and then a rinsing process is performed using a buffered oxide etchant. Here, the acid aqueous solution is an SPM solution.

Figure 6A:
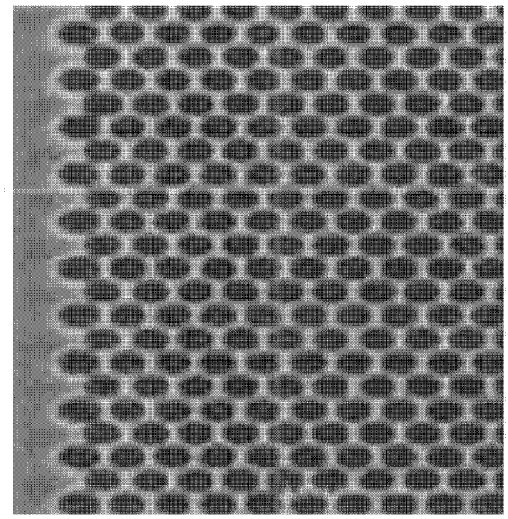
FIGS. 6A and 6B are photographs showing a critical dimension decrease of a minimum bar after a pre-treatment.
Figure 6B:
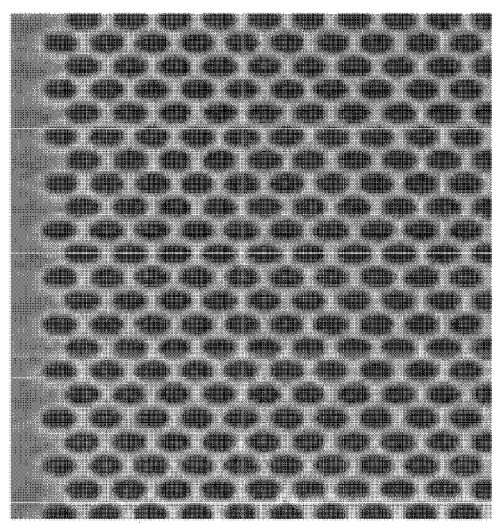

FIGS. 6A and 6B are photographs showing a critical dimension (CD) decrease of a minimum bar after a pre-treatment.

It may be seen from FIGS. 6A and 6B that, when comparing the critical dimensions of a BPSG minimum bar between holes, by using the acid aqueous solution, the loss was reduced by approximately 7 nm to approximately 10 nm. Here, for example, when the pre-treatment is not performed, the critical dimensions of the BPSG minimum bar are approximately 15 nm, whereas the critical dimensions of the BPSG minimum bar are approximately 23 nm when the pre-treatment is performed.

According to an exemplary embodiment of the present invention, since a pre-treatment is performed when an insulation layer, e.g., BPSG, PSG, or BSG, is exposed during the formation of via holes and/or contact holes of a semiconductor device, the surface of the insulation layer may be induced to be densified. Due to the resulting dense surface of the insulation layer, loss of the insulation layer may be minimized during a subsequent cleaning process to thereby decrease the frequency of the generation of bridges and other defects.

While the present invention has been described with respect to the specific exemplary embodiments, it will be apparent to those skilled in the art that various changes and modifications may be made without departing from the spirit and scope of the invention as defined in the following claims.

What is claimed is:

1. A method for fabricating a semiconductor device, comprising:
    forming an insulation layer containing an impurity;
    forming a contact hole by etching the insulation layer;
    performing a treatment to decrease a concentration of the impurity on a surface of the insulation layer; and
    rinsing the contact hole.

2. The method of claim 1, wherein the treatment is performed using a treatment solution prepared by mixing a catalyst for removing the impurity from the surface and an oxidizing agent for oxidizing voids created at the surface from the impurity removal.

3. The method of claim 2, wherein the catalyst comprises an acid having an acid dissociation constant (pKa) ranging from approximately −10 to approximately 1.

4. The method of claim 2, wherein the catalyst comprises an acid selected from the group consisting of perchloric acid, hydroiodic acid, hydrobromic acid, hydrochloric acid, peroxymonosulfuric acid, and sulfuric acid.

5. The method of claim 2, wherein the catalyst is included in the treatment solution in an amount of approximately 10 wt % to approximately 40 wt %.

6. The method of claim 2, wherein the oxidizing agent comprises hydrogen peroxide or ozone.

7. The method of claim 2, wherein a mixing ratio of the oxidizing agent to the catalyst ranges from approximately 4:1 to approximately 50:1 in the treatment solution.

8. The method of claim 2, wherein the treatment is performed at a temperature of approximately 90° C. to approximately 250° C. for approximately 5 minutes to approximately 60 minutes.

9. The method of claim 2, further comprising:
    performing a rinsing process and a drying process after the treatment.

10. The method of claim 1, wherein the insulation layer comprises at least one selected from the group consisting of Boron-Phosphorus-Silicate Glass (BPSG), phosphorus silicate glass (PSG), and boron silicate glass (BSG).

11. A method for fabricating a semiconductor device, comprising:
    forming a plurality of patterns over a substrate;
    forming an inter-layer dielectric layer to gap-fill spaces between the patterns, wherein the inter-layer dielectric layer contains phosphorus as an impurity;
    forming a contact hole by etching the inter-layer dielectric layer;
    performing a treatment for decreasing a concentration of the impurity on a surface of the inter-layer dielectric layer; and
    rinsing the contact hole.

12. The method of claim 11, wherein the treatment is performed using a sulfuric acid peroxide mixture (SPM) solution prepared by mixing sulfuric acid and hydrogen peroxide.

13. The method of claim 11, wherein the treatment is performed using an SPM solution prepared by mixing sulfuric acid and hydrogen peroxide in a ratio of approximately 4:1 to approximately 50:1.

14. The method of claim 11, wherein the treatment is performed using an SPM solution prepared by mixing sulfuric acid and hydrogen peroxide at a temperature of approximately 90° C. to approximately 250° C. for approximately 5 minutes to approximately 60 minutes.

15. The method of claim 11, wherein the treatment is performed using an SPM solution prepared by mixing hydrogen peroxide and sulfuric acid in a ratio of approximately 4:1 to approximately 50:1 at a temperature of approximately 90° C. to approximately 250° C. for approximately 5 minutes to approximately 60 minutes.

16. The method of claim 11, further comprising:
    performing a rinsing process and a drying process after the treatment.

17. The method of claim 11, wherein the inter-layer dielectric layer comprises Boron-Phosphorus-Silicate Glass (BPSG) or phosphorus silicate glass (PSG).

18. The method of claim 11, wherein the treatment includes removing the impurity from the surface to create voids and oxidizing the voids for densifying the surface.

19. A method for fabricating a semiconductor device, comprising:
    forming a first contact plug over a substrate;
    forming a Boron-Phosphorus-Silicate Glass (BPSG) layer over the first contact plug;
    forming a contact hole that exposes the first contact plug by etching the BPSG layer;
    performing a treatment on sidewalls of the contact hole by using a solution prepared by mixing sulfuric acid and hydrogen peroxide;
    rinsing the contact hole; and
    forming a second contact plug in the contact hole.

20. The method of claim 19, wherein the treatment includes removing boron and phosphorus from the BPSG layer to create voids and oxidizing the voids for densifying the sidewalls of the contact hole and the sidewalls are less prone to being damaged from the rinsing of the contact hole than before the densification.

* * * * *